United States Patent
Zhou et al.

(10) Patent No.: US 6,998,952 B2
(45) Date of Patent: Feb. 14, 2006

(54) INDUCTIVE DEVICE INCLUDING BOND WIRES

(75) Inventors: Yaping Zhou, Austin, TX (US); Susan H. Downey, Austin, TX (US); Sheila F. Chopin, Austin, TX (US); Tu-Anh Tran, Austin, TX (US); Alan H. Woosley, Austin, TX (US); Peter R. Harper, Lucas, TX (US); Perry H. Pelley, III, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 111 days.

(21) Appl. No.: 10/729,531

(22) Filed: Dec. 5, 2003

(65) Prior Publication Data

US 2005/0122198 A1    Jun. 9, 2005

(51) Int. Cl.
*H01F 27/06* (2006.01)
*H01F 5/00* (2006.01)

(52) U.S. Cl. .................. 336/200; 336/232; 336/192; 336/65; 29/602.1

(58) Field of Classification Search ............... 336/223, 336/200, 232, 65, 192; 29/602.1, 606; 257/E21.503, 257/E21.508, E21.068
See application file for complete search history.

(56) References Cited

U.S. PATENT DOCUMENTS

| | | | | |
|---|---|---|---|---|
| 3,263,191 A | * | 7/1966 | Arvonio et al. | 333/24 R |
| 3,614,554 A | * | 10/1971 | Shield et al. | 257/531 |
| 4,103,267 A | * | 7/1978 | Olschewski | 336/65 |
| 4,524,342 A | * | 6/1985 | Mas | 336/182 |
| 4,806,895 A | * | 2/1989 | Petrow | 336/65 |
| 5,140,706 A | * | 8/1992 | Maeda et al. | 455/326 |
| 5,425,166 A | * | 6/1995 | Hastings et al. | 29/602.1 |
| 5,425,167 A | * | 6/1995 | Shiga et al. | 29/606 |
| 5,428,245 A | | 6/1995 | Lin et al. | |
| 5,543,773 A | * | 8/1996 | Evans et al. | 336/183 |
| 5,640,127 A | | 6/1997 | Metz | |
| 5,767,563 A | * | 6/1998 | Imam et al. | 257/531 |
| 5,886,393 A | | 3/1999 | Merrill et al. | |
| 5,905,418 A | | 5/1999 | Ehara et al. | |
| 5,945,880 A | | 8/1999 | Souetinov | |
| 5,963,110 A | | 10/1999 | Ihara et al. | |
| 6,194,774 B1 | * | 2/2001 | Cheon | 257/531 |
| 6,417,755 B1 | | 7/2002 | Liu et al. | |
| 6,427,315 B1 | | 8/2002 | Kitagawa et al. | |
| 6,437,653 B1 | | 8/2002 | Cruz et al. | |

(Continued)

FOREIGN PATENT DOCUMENTS

EP        1 202 296 A1    5/2002

*Primary Examiner*—Anh Mai
(74) *Attorney, Agent, or Firm*—David G. Dolezal; Daniel D. Hill

(57) ABSTRACT

An inductive device (105) is formed above a substrate (225) having a conductive coil formed around a core (109). The coil comprises segments formed from a first plurality of bond wires (113) and a second plurality of bond wires (111). The first plurality of bond wires (113) extends between the core (109) and the substrate (225). Each of the first plurality of bond wires is coupled to two of a plurality of wire bond pads (117, 116). The second plurality of bond wires (111) extends over the core (109) and is coupled between two of the plurality of wire bond pads (117, 119). A shield (141) includes a portion that is positioned between the core (109) and the substrate (225).

26 Claims, 3 Drawing Sheets

U.S. PATENT DOCUMENTS

| | | |
|---|---|---|
| 6,452,473 B1 | 9/2002 | Suzuki et al. |
| 6,456,183 B1 | 9/2002 | Basteres et al. |
| 6,466,122 B1 | 10/2002 | Hasegawa et al. |
| 6,472,257 B1 | 10/2002 | Ferrari et al. |
| 6,478,975 B1 | 11/2002 | Ju |
| 6,480,086 B1 | 11/2002 | Kluge et al. |
| 6,480,087 B1 | 11/2002 | Oiwa et al. |
| 6,483,413 B1 | 11/2002 | Maeda et al. |
| 6,586,309 B1 | 7/2003 | Yeo et al. |
| 2003/0031339 A1 * | 2/2003 | Marshall et al. ............ 381/400 |

* cited by examiner

INDUCTIVE DEVICE INCLUDING BOND WIRES

BACKGROUND OF THE INVENTION

1. Field of the Invention

This invention relates in general to electronic circuits and in particular to inductive devices for electronic circuits.

2. Description of the Related Art

Inductor devices are utilized in electronic devices including e.g. radio frequency electronic devices. Examples of inductive devices include transformers and inductors. In some packaged electronic devices, inductive devices are manufactured separately and then added during the assembly of the packaged electronic device. With other systems, an inductive device may be formed with copper traces on a die.

Utilizing pre-assembled inductive devices in an electronic device may require additional assembly processes for the manufacture of the electronic device. Furthermore, separately manufactured inductive devices may introduce unwanted electrical parasitics due to the connectors of the pre-assembled part.

What is needed is an improved inductive device for an electronic device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
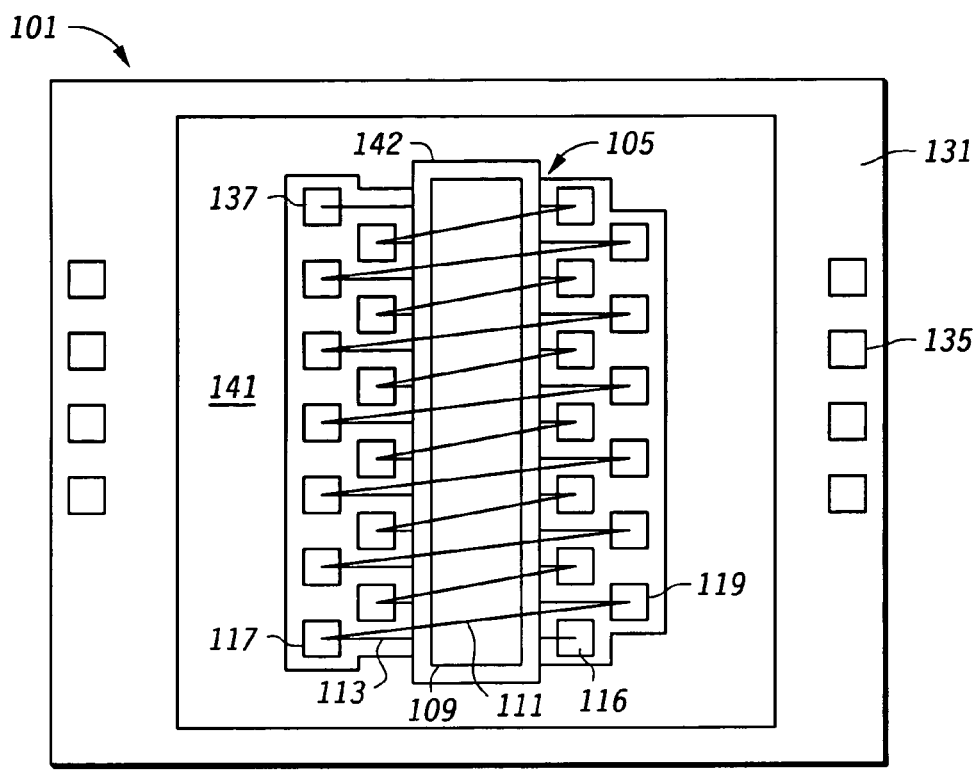
FIG. 1 is top view of one embodiment of a die including an inductor according to the present invention.

FIG. 1 is a top view of a integrated circuit die according to the present invention. An inductor 105 is located on a top side 131 of die 101. Inductor 105 includes a first set of bond wires (e.g. 113) including a portion located between a core 109 of magnetic material and the top side 131 of die 101 and a second set of bonding wires e.g. 111 including a portion located over core 109. In one embodiment core 109 is made of a ferrite material, but may include other types of magnetic material in other embodiments, e.g. ferromagnetic material. Each of the bond wires of the first and second sets are bonded to a pair of bond pads (e.g. 117 and 119 for bond wire 111) and function as segments of a coil around core 109 of inductor 105. Bond wires 111 and 113 are made of a conductive material such as e.g. gold, copper, or aluminum.

Bond pads (e.g. 135) are located on the top side 131 of die 101 for providing external coupling of the circuitry (not shown) of die 101. These bond pads may be wire bonded to bond pads of a package substrate (not shown) of which die 101 is implemented.

Figure 2:
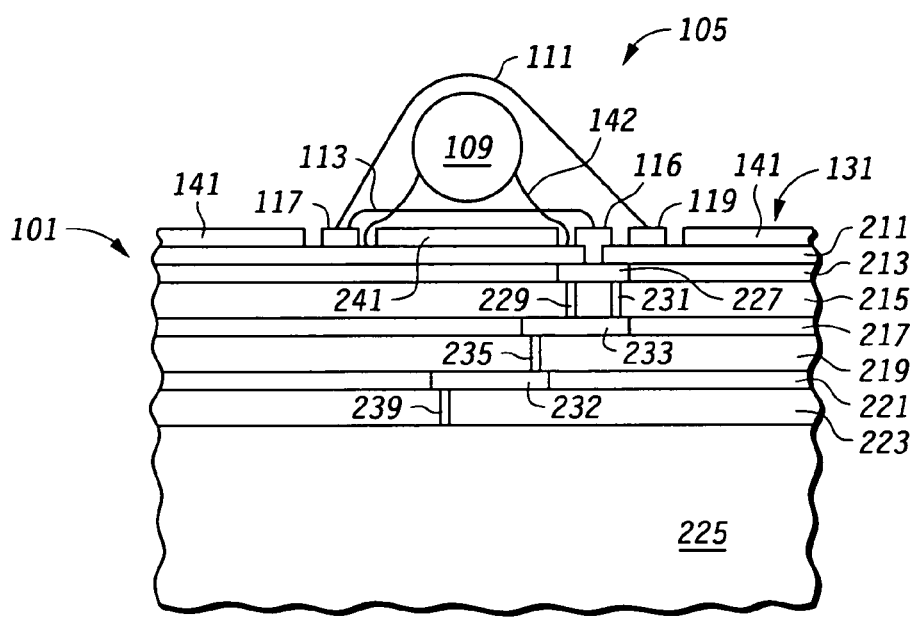
FIG. 2 is a partial side view of one embodiment of a die and inductor according to the present invention.

FIG. 2 is a partial side cross sectional view of die 101 and inductor 105. As shown in FIG. 2, bond wire 111 extends over core 109 and is bonded to bond pad 117 and bond pad 119. Bond wire 113 has a lower profile than bond wire 111, extends between core 109 and die 101, and is bonded to pad 117 and pad 116.

In the embodiment shown, core 109 is attached to die 101 with insulative epoxy 142 that runs the length of core 109. The bond wires of the first set (e.g. 113) extend through insulative epoxy 142.

Die 101 includes a substrate 225 and a plurality of interconnect layers (223, 221, 219, 217, 215, and 213) formed over substrate 225. Substrate 225 is made of silicon or other type of semiconductor material (e.g. GaAs). Devices such as transistors and diodes (not shown) are formed in substrate 225 to implement active circuitry of die 101. The plurality of interconnect layers include conductive structures such as metal interconnects (e.g. 233) and conductive vias (e.g. 235). In the embodiment shown, a passivation layer 211 is located over the metal layer 213.

An aluminum shield 141 is formed over passivation layer 211 and includes a portion 241 located beneath core 109. Shield 141 provide shielding to decrease magnetic coupling from inductor 105 with the circuitry in substrate 225 and conductive structures in the interconnect layers. Shield 141 is electrically isolated from the bond pads (e.g. 117, 119, and 135). In the embodiment shown, insulative epoxy 142 covers portion 241 of shield 141 under core 109 to aid in the isolation of the bond wires from shield 141. Providing a shield between an inductive device and die may allow for conductive structures to be implemented in the interconnect layers beneath inductor 105 thereby allowing for the implementation of active circuitry in substrate 225 below inductor 105.

Bond pads 117 and 119 are formed on a passivation layer 211. Bond pad 116 is formed over and is in electrical contact with a conductive structure 227 of metal layer 213 through an opening in passivation layer 211. In one embodiment, the bond pads (117, 116, 119, and 135) and shield 141 are formed from a patterned aluminum layer formed over passivation layer 221. In other embodiments, the bond pads and shield 141 are made of other types of conductive material (e.g. copper). In other embodiments, a barrier layer (not shown) may be located between bond pads (e.g. 116) and conductive structures (e.g. 227) of metal layer 213.

In the embodiment shown, inductor 105 is coupled to active circuitry in substrate 225 via pad 116, conductive structure 227 in metal layer 213, conductive vias 229 and 231 in via layer 215, conductive structure 233 in metal layer 217, conductive via 235 in via layer 219, conductive structure 232 in layer 221, and contact 239 in contact layer 223. The conductive structures in the interconnect layers are made of a conductive material (e.g. copper, aluminum, and tungsten). The interconnect layers of die 101 may include adhesive layers and/or diffusion barrier layers not shown. In other embodiments, the bond pads at the end of the coil (e.g. 116 and 137) may be wire bonded to other bond pads of die 101 or to bond pads of a package substrate (not shown) to which die 101 is mounted for encapsulation to form a packaged electronic device.

Figure 3:
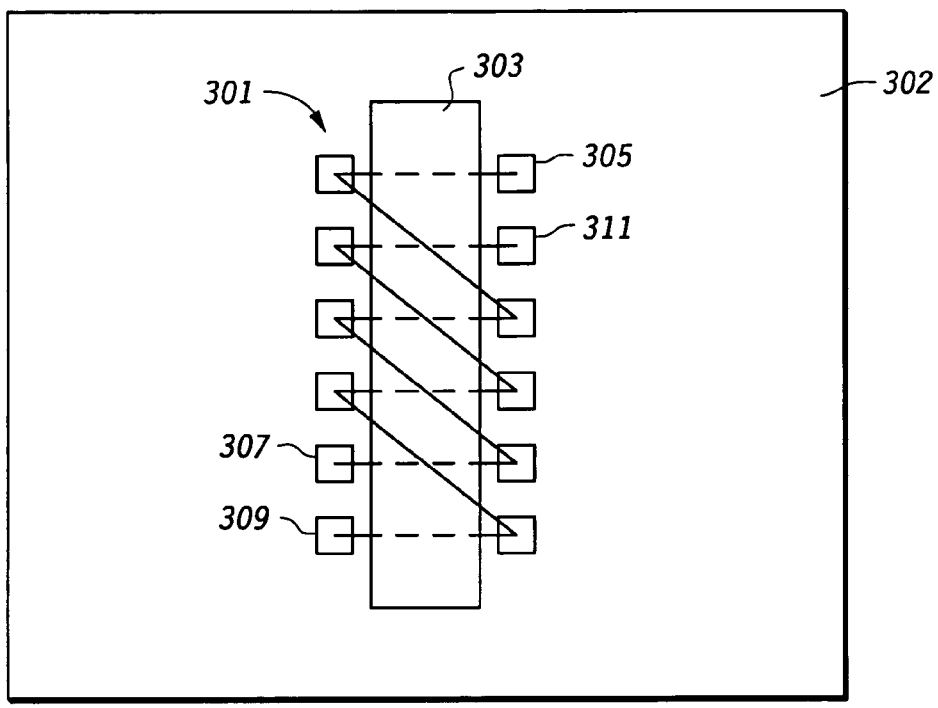
FIG. 3 is a top view of one embodiment of a transformer according to the present invention.

FIG. 3 is a top view of a transformer 301 formed on a substrate 302. Transformer 301 includes two sets of coils with each including a first set of bond wires including portions extending between the substrate 302 and magnetic core 303 and a second set of bond wires including portions extending over core 303. Each of the bond wires are bonded to bond pads (e.g. 307) located on substrate 302. The first coil extends from bond pad 305 to bond pad 307 and the second coil extends from pad 311 to pad 309. In one embodiment, the first coil would serve as the primary winding and the second coil would serve as the secondary winding.

In one embodiment, substrate 302 is made of dielectric material and the bond pads (e.g. 305) are made of copper. In one embodiment, pads 307, 309, 305 and 311 are coupled to conductive vias (not shown) extending into substrate 302 for coupling to external coupling devices (e.g. solder balls, external bond pads) formed on the backside (not shown) of substrate 302. In some embodiments, substrate 302 may be made of a dielectric material such as e.g. ceramic, glass, FR4, or bismalemide triazine. In other embodiments, the substrate may be made of a conductive material e.g. where the substrate is a lead frame.

In one embodiment, transformer 301 and substrate 302 are encapsulated to form a stand alone inductor. In another embodiment, inductor 301 is formed on a substrate in which an IC die (not shown) is attached (e.g. either adjacent to or on the opposite side of substrate 302). In such embodiments, the die, substrate, and transformer are encapsulated.

In the embodiments shown, core 109 and core 303 each have a cylindrical shape. However, other embodiments may include cores may have other shapes in other embodiments, such as e.g. a bar, toroid, and a square or rectangular frame with a rectangular cross section or circular cross section.

Figure 4:
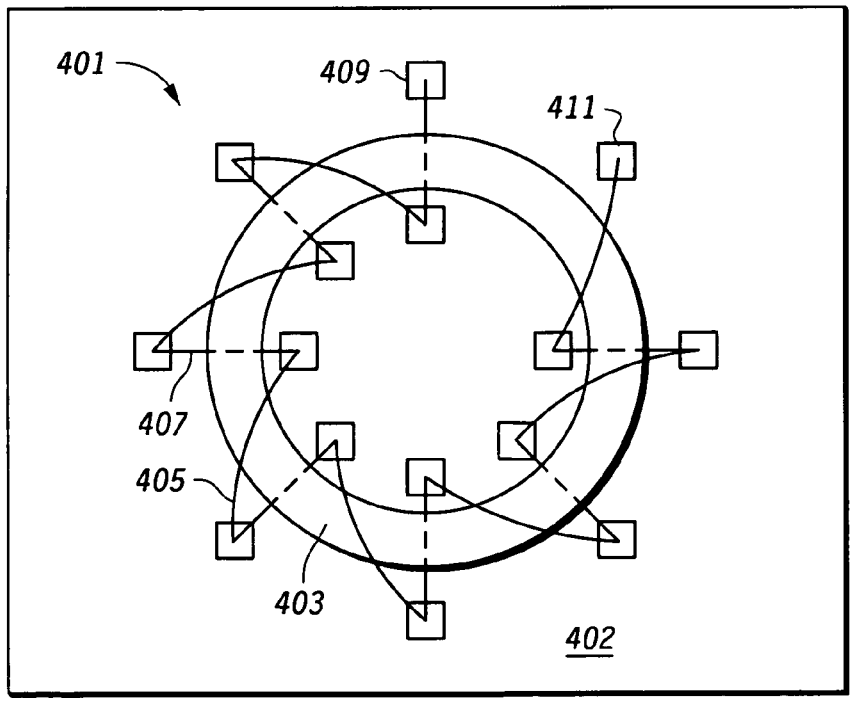
FIG. 4 is a top view of one embodiment of an inductor according to the present invention.

FIG. 4 is a top view of an inductor 401 formed on a substrate 402. The coil of inductor 401 includes a first plurality of bond wires e.g. 407 having a portion extending between substrate 402 and core 403 and a second plurality of bond wires e.g. 405 having a higher profile and a portion extending over core 403. The bond wires of the first and second sets are bonded to bond pads (e.g. 409) on substrate 402. In the embodiment shown, core 403 is made of a magnetic material, has a ring form, and has a square cross section. In one embodiment, core 403 is attached in substrate 402 with an epoxy (not shown). The bond wires of the first set (e.g. 407) extend through the epoxy.

Figure 5:
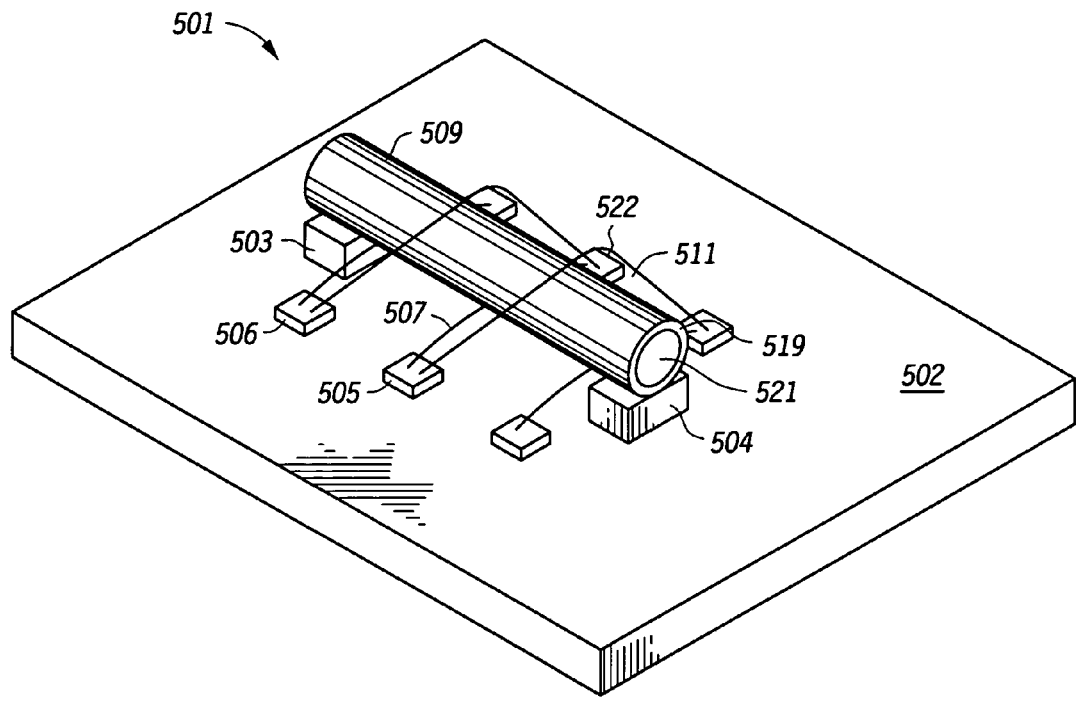
FIG. 5 is a perspective view of one embodiment of an inductor according to the present invention.

FIG. 5 is a perspective view of another embodiment of an inductive device. Core 509 includes core magnetic material 521 surrounded by a coat of insulative material 519. Core 509 is attached to substrate 502 with the use of standoffs 503 and 504. Standoffs 503 and 504 provide a predetermined clearance between the top side of substrate 502 and core 509 where bond wires (e.g. 507) pass from bond pads (e.g. 505) on a first side of core 509 to bond pads 522 on the other side of core 509.

In one embodiment, standoffs 503 and 504 are attached to substrate 502 prior to the bonding of the first set of bond wires (e.g. 507) with core 509 being attached thereafter. In another embodiment, standoffs 503 and 504 are attached to substrate 502 after the first set of bond wires (e.g. 507) are attached. In another embodiment, standoffs 503 and 504 are first attached to core 509. Then the core/standoff assembly is attached to substrate 502 after the bonding of the first set of bond wires (e.g. 507).

In the embodiment of FIG. 5, core material 521 is ferromagnetic. An insulative coating 519 coats core material 521 to electrically isolate core material 521 (which is electrically conductive) from the uninsulative bond wires. Providing a conductive core may provide an inductive device with a higher permeability thereby providing a higher inductance. Other inductive devices may include insulated bond wires and a ferromagnetic core with no insulative coating.

In the embodiment shown, substrate 502 is made of a dielectric material. In other embodiments, standoffs 503 and 504 may be attached to the top of a die (e.g. 101).

Figure 6:
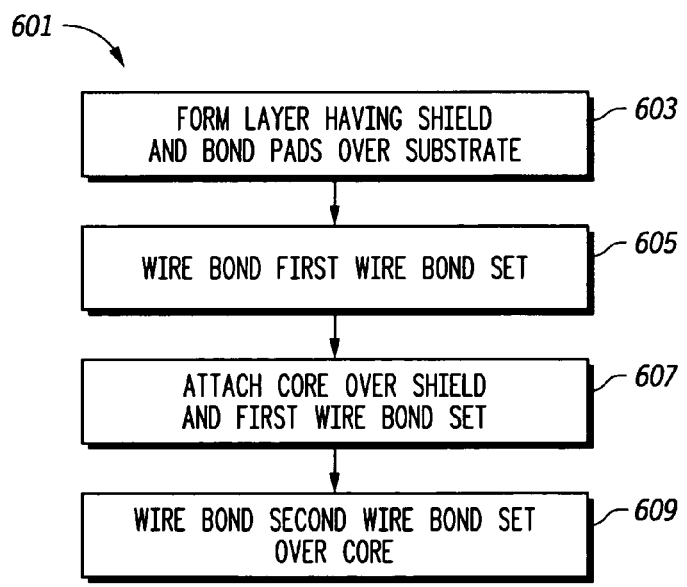
FIG. 6 is a flow diagram of one embodiment of making die with an inductive device according to the present invention.

FIG. 6 sets forth one embodiment for making an inductive device according to the present invention. In 603, the bond pads and a shield (e.g. 141) are formed over a substrate. For the embodiment of FIG. 1, in 601, an aluminum layer is deposited on passivation layer 211 and then patterned to form the bond pads (e.g. 117, 119, and 116) and aluminum shield 141.

In 605, the first set of bond wires having the lower profile (e.g. 113) are bonded to the bond pads. In 607, a core is mounted over the bond wires (e.g. 113). In the embodiment of FIG. 2, the core is attached to the top of the die (e.g. 101) with insulative epoxy (e.g. 142) wherein the bond wires of the first set extend through the insulative epoxy. In 609, the second set of bond wires are bonded to extend over the core.

In some embodiments, the inductor and substrate are then encapsulated. With an embodiment where the inductor is attached to a die, the inductor and die are attached to a package substrate wherein bond pads of the die (and bond pads of the inductor in some embodiments) are bonded to bond pads of the package substrate. The entire package is then encapsulated.

With the manufacture of some embodiments, test runs of a packaged electronic device may be constructed and measurements made to determine the inductance of the inductive device. From these measurements, inductive devices on subsequently built devices may be adjusted to tune the inductance. For example, subsequent inductive devices may be constructed with less bond wires to reduce the effective length of the coil, and thereby the inductance of the inductive device.

Providing an inductive device with bond wires extending between a substrate and core may advantageously allow for a more dense placement of conductors extending between the core and the substrate over an inductive device having only traces extending between the core and substrate. Providing for a more dense placement may advantageously allow the inductive device to occupy less space. Furthermore, utilization of bond wires beneath the core and substrate of an inductive device may allow for placement of a shield between the substrate and core which may include at least portions formed in the same layer as the bond pads.

It will be appreciated that features shown or described with respect to any one embodiment may be incorporated into other embodiments shown or described herein. For example, a transformer similar to transformer 301 of FIG. 3 may be attached to an IC die (e.g. 101). As another example, a transformer similar to transformer 301 may be attached to a substrate 302 with standoffs (e.g. 503 and 504).

In one embodiment, an inductive device includes a core coupled to a substrate and a conductive coil surrounding the core. The coil comprises segments formed from a first plurality of bond wires and a second plurality of bond wires. The first plurality of bond wires extends between the core and the substrate. Each of the first plurality of bond wires is coupled to two of a plurality of wire bond pads. The second plurality of bond wires extends over the core and is coupled between two of the plurality of wire bond pads.

In another embodiment, a method for forming an inductive device comprises attaching a first plurality of bond wires between first pairs of a plurality of wire bond pads, positioning a core over the first plurality of bond wires, and attaching a second plurality of bond wires between second pairs of the plurality of wire bond pads. The second plurality of bond wires extends over the core.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An inductive device, comprising:
    a core coupled to a substrate; and
    a conductive coil surrounding the core, the coil comprising segments formed from a first plurality of bond wires and a second plurality of bond wires, the first plurality of bond wires extending between the core and the substrate, each of the first plurality of bond wires coupled to two of a plurality of wire bond pads, and the second plurality of bond wires extending over due core and coupled between two of the plurality of wire bond pads, wherein the core is coupled to the substrate using epoxy, the first plurality of bond wires extending through the epoxy.

2. The inductive device of claim 1, wherein the core includes a magnetic material selected from a group consisting of a ferrite material and a ferromagnetic material.

3. The inductive device of claim 1, wherein the core is cylindrical in shape.

4. The inductive device of claim 1, wherein the core is toroidal in shape.

5. The inductive device of claim 1, wherein the substrate is made of a silicon material.

6. The inductive device of claim 1 wherein the substrate is made of a semiconductor material.

7. The inductive device of claim 1 wherein the substrate is characterized as a lead frame.

8. The inductive device of claim 1, farther comprising a standoff for supporting the core a predetermined distance above a surface.

9. The inductive device of claim 1, wherein the first and second plurality of bond wires includes a conductive material selected from a group consisting of gold, copper, and aluminum.

10. The inductive device of claim 1, further comprises a metal shield positioned between at least a portion of the inductive device and the substrate.

11. The inductive device of claim 10, wherein the substrate is part of an integrated circuit die, and wherein the metal shield and the plurality of wire bond pads are formed from a top metal layer of the integrated circuit die.

12. The inductive device of claim 11, wherein the top metal layer is formed from at least a metal selected from a group consisting of aluminum and copper.

13. The inductive device of claim 1, wherein the inductive device is characterized as a transformer.

14. The inductive device of claim 1, wherein the inductive device is characterized as an inductor.

15. An inductive device, comprising:
    a core coupled to a substrate; and
    a conductive coil surrounding the core, the coil comprising segments formed from a first plurality of bond wires and a second plurality of bond wires, the first plurality of bond wires extending between the core and the substrate, each of the first plurality of bond wires coupled to two of a plurality of wire bond pads, and the second plurality of bond wires extending over the core and coupled between two of the plurality of wire bond pads, wherein the substrate is part of an integrated circuit die, the core being located over the die, and wherein the core is coupled to the substrate using epoxy, the first plurality of bond wires extending through the epoxy.

16. The inductive device of claim 15 wherein the first plurality of bond wires are insulated and the second plurality of bond wires are insulated.

17. A method for forming an inductive device, comprising:
    attaching a first plurality of bond wires between first pairs of a plurality of wire bond pads;
    positioning a core over the first plurality of bond wires;
    attaching a second plurality of bond wires between second pairs of the plurality of wire bond pads, the second plurality of bond wires extending over the core; and
    coupling the core to a substrate using epoxy, the first plurality of bond wires extending through the epoxy.

18. The method of claim 17, wherein the plurality of wire bond pads is coupled to a substrate, wherein the substrate is made of a silicon material.

19. The method of claim 17, wherein the plurality of wire bond pads is coupled to a substrate, wherein the substrate is made of a semiconductor material.

20. The method of claim 17, wherein the plurality of wire bond pads is coupled to a substrate, wherein a metal shield is positioned between the core and the substrate.

21. The method of claim 20, wherein the metal shield and the plurality of wire bond pads include aluminum.

22. The method of claim 17, wherein the core includes a magnetic material selected from a group consisting of a ferrite material and a ferromagnetic material.

23. The method of claim 17, further comprising providing a standoff for supporting the core a predetermined distance above a surface.

24. The method of claim 17, wherein the first and second plurality or bond wires includes a conductive material selected from a group consisting of gold, copper, and aluminum.

25. The method of claim 17, wherein the substrate is part of an integrated circuit die, the core being positioned over the die.

26. The method of claim 17 wherein the first plurality of bond wires are insulated and the second plurality of bond wires are insulated.

* * * * *

UNITED STATES PATENT AND TRADEMARK OFFICE
CERTIFICATE OF CORRECTION

PATENT NO. : 6,998,952 B2  Page 1 of 1
APPLICATION NO. : 10/729531
DATED : February 14, 2006
INVENTOR(S) : Yaping Zhou It is certified that error appears in the above-identified patent and that said Letters Patent is hereby corrected as shown below:

In Column 5, Line 25, Claim No. 1:
Change "plurality of bond wires extending over due core" to --plurality of bond wires extending over the core--

In Column 6, Line 49, Claim No. 26:
Change "plurality or bond wires includes a conductive material" to --plurality of bond wires includes a conductive material--

Signed and Sealed this

Fifth Day of August, 2008

JON W. DUDAS
*Director of the United States Patent and Trademark Office*